United States Patent
Meng et al.

(10) Patent No.: US 11,442,115 B2
(45) Date of Patent: Sep. 13, 2022

(54) METHOD AND APPARATUS FOR CIRCUIT MONITORING

(71) Applicant: ABB Schweiz AG, Baden (CH)

(72) Inventors: Jinlei Meng, Beijing (CN); Bo Wang, Beijing (CN); Haitao Deng, Beijing (CN)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/223,423

(22) Filed: Apr. 6, 2021

(65) Prior Publication Data

US 2021/0223332 A1 Jul. 22, 2021

Related U.S. Application Data

(63) Continuation of application No. PCT/CN2018/109502, filed on Oct. 9, 2018.

(51) Int. Cl.
*G01R 31/12* (2020.01)
*G01R 31/64* (2020.01)
*H02M 5/458* (2006.01)

(52) U.S. Cl.
CPC ............ *G01R 31/64* (2020.01); *H02M 5/458* (2013.01)

(58) Field of Classification Search
CPC ...... G01R 31/64; G01R 31/42; G01R 31/016; G01R 31/028; G01R 31/36; G01R 31/364; G01R 31/389; G01R 31/392; H02M 5/458; H02M 5/4585; H02M 1/4283
See application file for complete search history.

(56) References Cited

U.S. PATENT DOCUMENTS

| | | | |
|---|---|---|---|
| 9,535,107 B2 | 1/2017 | Yang | |
| 10,401,415 B2* | 9/2019 | Tateda | .............. G01R 31/42 |
| 2009/0072983 A1 | 3/2009 | Cheng et al. | |
| 2009/0112493 A1 | 4/2009 | Abdennadher et al. | |
| 2013/0155729 A1 | 6/2013 | Lee | |
| 2014/0012522 A1 | 1/2014 | Colombi et al. | |

(Continued)

FOREIGN PATENT DOCUMENTS

| | | |
|---|---|---|
| CA | 2387969 A1 | 3/2002 |
| CN | 101918852 A | 12/2010 |

(Continued)

OTHER PUBLICATIONS

Intellectual Property Office of the P.R. China, International Search Report & Written Opinion issued in corresponding Application No. PCT/CN2018/109502, dated Jul. 19, 2019, 10 pp.

(Continued)

*Primary Examiner* — Thang X Le
(74) *Attorney, Agent, or Firm* — Greenberg Traurig, LLP

(57) ABSTRACT

A method for circuit monitoring includes detecting a waveform of first voltage at a DC-link capacitor in a power converter, the first voltage being generated by turning on a chopper circuit coupling in parallel to the DC-link; determining a phase angle shift of the waveform of first voltage with respect to a waveform of second voltage at a rectifier in the power converter or a power supply for the power converter; determining magnitude of the waveform of first voltage; and determining, based on at least one of the magnitude and the phase angle shift, a parameter indicative of a health condition of the DC-link capacitor. An apparatus is also provided.

19 Claims, 7 Drawing Sheets

(56) References Cited

U.S. PATENT DOCUMENTS

| | | | |
|---|---|---|---|
| 2014/0347896 A1* | 11/2014 | Chung | H02M 5/458 363/34 |
| 2016/0006347 A1 | 1/2016 | Matsui et al. | |
| 2017/0099012 A1 | 4/2017 | Niwa | |
| 2018/0062557 A1* | 3/2018 | Tao | H02M 1/32 |
| 2019/0280607 A1* | 9/2019 | Tanaka | G01R 31/64 |

FOREIGN PATENT DOCUMENTS

| | | |
|---|---|---|
| CN | 102445615 A | 5/2012 |
| CN | 103529315 A | 1/2014 |
| CN | 104040441 A | 9/2014 |
| CN | 105556817 A | 5/2016 |
| CN | 105785136 A | 7/2016 |
| CN | 105830326 A | 8/2016 |
| CN | 106464148 A | 2/2017 |
| CN | 108352779 A | 7/2018 |
| WO | WO-2019127184 * | 7/2019 |

OTHER PUBLICATIONS

China First Office Action, issued by the National Intellectual Property Administration, regarding corresponding patent application Serial No. CN 201880099345.3; dated Mar. 2, 2022; 14 pages (with English translation).

Extended European Search Report, issued by the European Patent Office, regarding corresponding patent application Serial No. EP 18936759.2; dated May 9, 2022; 5 pages.

* cited by examiner

METHOD AND APPARATUS FOR CIRCUIT MONITORING

TECHNICAL FIELD

Example embodiments of the present disclosure generally relate to circuit monitoring and more particularly, to a method and apparatus for monitoring of a direct current (DC)-link capacitor in a power converter.

BACKGROUND

Capacitors, especially electrolytic capacitors (E-Cap), are widely used in power electronic converters, specifically in the direct current (DC)-link circuit. However, the capacitors will degrade with time and fail more frequently than other components in the power converters, which will threaten reliability of the power converters. To ensure reliability of power converters, it is desirable to carry out monitoring of the capacitors in the power converters so as to enable the indication of future failure occurrences and preventive maintenance.

The capacitor degradation usually manifests by a decrease in capacitance and/or an increase in equivalent series resistance (ESR). Earlier detection of the ESR increase or capacitance decrease allows for preventive mitigation actions, such as scheduling shutdown and repairs. Moreover, it is also helpful with evaluation of the expected operational time until failure may happen. Preventing the increase of the ESR or decrease of the capacitance over a specified level provides maintaining the quality of converted power and protects the power converter from failure of DC-link capacitor(s).

Solutions for monitoring have been studied for a long time but most of them are not suitable for real products. Most of the known solutions require additional hardware such as an external switching circuit, capacitor current sensor, or enhanced voltage sensor which includes an additional sample processing circuit. The impact on the main circuit, mechanical structure, or control circuit may lead to a redesign of the power converters, which is undesirable. Some monitoring approaches do not require additional hardware, but provide low precision and/or have limited applications in some special scenarios or some certain converters. U.S. Pat. No. 9,535,107B2 describes such a monitoring approach. Moreover, some methods will suspend the normal operations of the power converters.

SUMMARY

Example embodiments of the present disclosure propose a solution for circuit monitoring.

In a first aspect, example embodiments of the present disclosure provide a method for circuit monitoring, comprising: detecting a waveform of first voltage at a DC-link capacitor in a power converter, the first voltage being generated by turning on a chopper circuit coupling in parallel to the DC-link; determining a phase angle shift of the waveform of first voltage with respect to a waveform of second voltage at a rectifier in the power converter or a power supply for the power converter; determining magnitude of the waveform of first voltage; and determining, based on at least one of the magnitude and the phase angle shift, a parameter indicative of a health condition of the DC-link capacitor.

In some embodiments, determining the parameter comprises at least one of the following: determining capacitance of the DC-link capacitor based on the magnitude; and determining equivalent series resistance (ESR) of the DC-link capacitor based on the phase angle shift.

In some embodiments, determining the capacitance comprises determining, based on the magnitude, the capacitance with a lookup table storing relationship between capacitances and magnitudes; and determining the ESR comprises determining, based on the phase angle shift, the ESR with a lookup table storing relationship between ESRs and phase angle shifts.

In some embodiments, the method further comprises: comparing the determined parameter with a threshold; and generating an alert signal in response to the determined parameter exceeding the threshold.

In some embodiments, the method further comprises: determining a first ratio of the capacitance to an initial capacitance of the DC-link capacitor; determining a second ratio of the ESR to an initial ESR of the DC-link capacitor; and determining residue time based on at least one of the first ratio and second ratio.

In some embodiments, determining the phase angle shift comprises: detecting a first phase angle of the waveform of first voltage and a second phase angle of the waveform of second voltage simultaneously; and determining difference between the first phase angle and the second angle as the phase angle shift.

In some embodiments, the method further comprises: detecting a phase angle of the waveform of second voltage; and detecting the waveform of first voltage in response to the detected phase angle arriving at a predetermined angle.

In some embodiments, determining the phase angle shift comprises: detecting a first phase angle of the waveform of first voltage; and determining a difference between the first phase angle and the predetermined angle as the phase angle shift.

In some embodiments, the method is performed in case that no load of the power converter is present and the voltage at the DC-link capacitor is stable.

In some embodiments, the method further comprises: filtering the waveform of first voltage with a high pass filter; and determining, based on the filtered waveform of first voltage, the phase angle shift and the magnitude.

In a second aspect, example embodiments of the present disclosure provide a computer readable medium having instructions stored thereon, the instructions, when executed on at least one processor, cause the at least one processor to perform the method of the first aspect.

In a third aspect, example embodiments of the present disclosure provide a computer program product being tangibly stored on a computer readable storage medium and comprising instructions which, when executed on at least one processor, cause the at least one processor to perform the method of the first aspect.

In a fourth aspect, example embodiments of the present disclosure provide an apparatus for circuit monitoring, comprising: a detector and a controller. The detector is configured to detect a waveform of first voltage at a DC-link capacitor in a power converter, the first voltage being generated by turning on a chopper circuit coupling in parallel to the DC-link. The controller is configured to determine a phase angle shift of the waveform of first voltage with respect to a waveform of second voltage at a rectifier in the power converter or a power supply for the power converter; determine magnitude of the waveform of first voltage; and determine, based on at least one of the magnitude and the phase angle shift, a parameter indicative of a health condition of the DC-link capacitor.

In some embodiments, the controller is further configured to determine at least one of the following: capacitance of the DC-link capacitor based on the magnitude; and equivalent series resistance (ESR) of the DC-link capacitor based on the phase angle shift.

In some embodiments, the controller is further configured to determine, based on the magnitude, the capacitance with a lookup table storing relationship between capacitances and magnitudes; and determine, based on the phase angle shift, the ESR with a lookup table storing relationship between ESRs and phase angle shifts.

In some embodiments, the controller is further configured to compare the determined parameter with a threshold; and generate an alert signal in response to the determined parameter exceeding the threshold.

In some embodiments, the controller is further configured to detect a first phase angle of the waveform of first voltage and a second phase angle of the waveform of second voltage simultaneously; and determine a difference between the first phase angle and the second angle as the phase angle shift.

In some embodiments, the controller is configured to operate in case that no load of the power converter is present and the voltage at the DC-link capacitor is stable.

In a fifth aspect, example embodiments of the present disclosure provide a power conversion system, comprising: a power converter; and an apparatus of the fourth aspect, configured to monitoring a direct current (DC)-link capacitor in the power converter.

In a sixth aspect, example embodiments of the present disclosure provide an Internet of Things (IoT) system comprising: a power converter; and an apparatus of the fourth aspect, configured to monitoring a direct current (DC)-link capacitor in the power converter.

BRIEF DESCRIPTION OF THE DRAWINGS

Through the following detailed descriptions with reference to the accompanying drawings, the above and other objectives, features and advantages of the example embodiments disclosed herein will become more comprehensible. In the drawings, several example embodiments disclosed herein will be illustrated in an example and in a non-limiting manner, wherein.

Throughout the drawings, the same or corresponding reference symbols refer to the same or corresponding parts.

DETAILED DESCRIPTION

Figure 1:
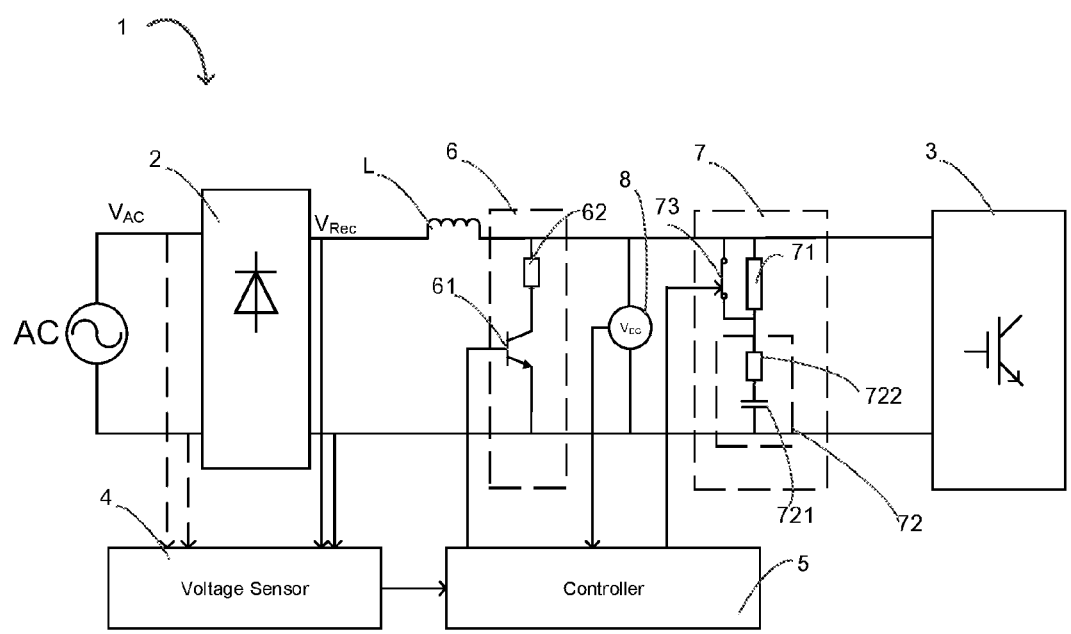
FIG. 1 illustrates a schematic diagram of a power conversion system with an apparatus of circuit monitoring in accordance with some example embodiments of the present disclosure.

The subject matter described herein will now be discussed with reference to several example embodiments. These embodiments are discussed only for the purpose of enabling those skilled persons in the art to better understand and thus implement the subject matter described herein, rather than suggesting any limitations on the scope of the subject matter.

The term "comprises" or "includes" and its variants are to be read as open terms that mean "includes, but is not limited to." The term "or" is to be read as "and/or" unless the context clearly indicates otherwise. The term "based on" is to be read as "based at least in part on." The term "being operable to" is to mean a function, an action, a motion or a state can be achieved by an operation induced by a user or an external mechanism. The term "one embodiment" and "an embodiment" are to be read as "at least one embodiment." The term "another embodiment" is to be read as "at least one other embodiment."

Unless specified or limited otherwise, the terms "mounted," "connected," "supported," and "coupled" and variations thereof are used broadly and encompass direct and indirect mountings, connections, supports, and couplings. Furthermore, "connected" and "coupled" are not restricted to physical or mechanical connections or couplings. In the description below, like reference numerals and labels are used to describe the same, similar or corresponding parts in the Figures. Other definitions, explicit and implicit, may be included below.

As mentioned above, a decrease in capacitance and/or an increase in equivalent series resistance (ESR) can be used as indicators to manifest degradation of a DC-link capacitor in a power converter. Thus, the decrease in capacitance and the increase in ESR need to be monitored.

FIG. 1 illustrates a schematic diagram of a power conversion system 1 with an apparatus of circuit monitoring in accordance with some example embodiments of the present disclosure. The power conversion system 1 includes a rectifier 2, an inductor L, a chopper circuit 6, a voltage detector 8, a DC-link 7 and an inverter 3. The AC source provides a supply voltage $V_{AC}$ to the rectifier 2 for generating a rectified voltage $V_{Rec}$. The rectified voltage $V_{Rec}$ is provided via the inductor L to the DC-link 7 for charging a capacitor 72 in the DC-link 7. The DC-link 7 also includes a charging resistor 71 in serial connection with the capacitor 72.

In an example, the capacitor 72 is an electrolytic capacitor (E-Cap). The capacitor 72 may be demonstrated as a serial connection of an effective capacitor 721 and an ESR 722 in an equivalent circuit. In a charging stage, the switch 73 coupled in parallel to the charging resistor 71 may be turned off such that the current from the inductor L may charge the capacitor 72. The switch will be turned on so as to short-circuit the charging resistor 71 in a stable stage subsequent to the charging stage.

The voltage sensor 4 is configured to detect at least one of a voltage $V_{AC}$ at the power supply AC and a voltage $V_{Rec}$ rectified by the rectifier 2. The controller 5 is configured to receive a first voltage $V_{DC}$ from the voltage detector 8, turn on or off the switch 73 coupled in parallel to the charging resistor 71, and turn on or off the switch transistor 61 in the chopper circuit 6. In an example, the controller 5 may be a digital signal processor. This is merely for illustration without suggesting any limitations as to the scope of the subject matter described here. The controller 5 may be other processors or other controlling device.

The voltage detector 8 is widely employed in conventional power conversion system. In this case, the embodiments herein can reutilize the voltage detector 8 in the conventional power conversion system without incurring any additional cost. Alternatively, an independent voltage detector 8 may be provided in the apparatus for circuit monitoring to detect the first voltage $V_{DC}$. This is merely for illustration without suggesting any limitations as to the scope of the subject matter described here. The first voltage $V_{DC}$ may also be detected by the voltage sensor 4 instead. In an example, the apparatus for circuit monitoring may include a high pass filter for filtering the waveform of the first voltage $V_{DC}$. The controller 5 may determine more precisely the phase angle and magnitude based on the filtered waveform of the first voltage $V_{DC}$.

The apparatus for circuit monitoring may also include the voltage senor 4 and the controller 5. The controller 5 may include a storage device, such as a memory, to store predetermined data, such as a lookup table. Alternatively, the storage device may be provided independently in the apparatus for circuit monitoring.

The storage device may store the relationship between the magnitude of the voltage and the capacitance and the relationship between the phase angle shift and the ESR. In addition, it may also store a predetermined threshold.

The controller 5 may compare the determined parameter with the threshold, and generate an alert signal in response to the determined parameter exceeding the threshold, for example the determined ESR being greater than the threshold for ESR and/or the determined capacitance being below than the threshold for capacitance. In an example, the alert signal may be transmitted from the controller 5 to a speaker for broadcasting. This is merely for illustration without suggesting any limitations as to the scope of the subject matter described here. Other suitable alert may be possible. For example, the alert signal may be transmitted to the cloud for monitoring the power conversion systems.

Figure 2A:
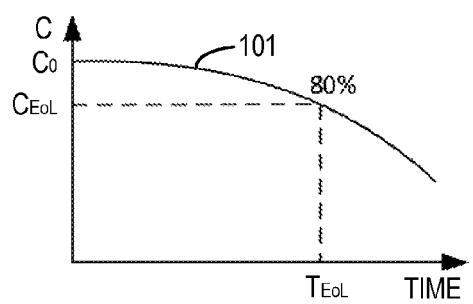
FIGS. 2A-2B illustrate curve graphs showing example degradation of capacitance and ESR of a DC-link capacitor.
Figure 2B:
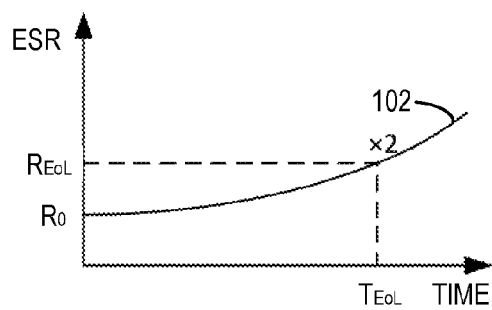

As described above, capacitance of the capacitor 721 may decrease, the resistance of the resistor 722 may increase. FIGS. 2A-2B illustrate curves 101 and 102 of degradation of ESR and capacitance of a capacitor, respectively. The curves 101 and 102 show a lifetime model of the DC-link capacitor. As shown, the capacitance value (C) of the capacitor, e.g., electrolytic capacitor, will decrease over time from its initial value C0, while the ESR of the capacitor will increase over time from its initial value R0. The widely accepted end-of-life (TEoL) criterion is that the ESR increases to double of the initial value (R0) and/or the capacitance decreases to 80% of the initial value (C0). At that time (TEoL), the capacitor may be replaced with a new one to guarantee the reliability of the power converter.

It is important to detect the capacitance and/or ESR so as to carry out monitoring of the capacitor. The inventor discovered that the voltage $V_{DC}$ of the DC-link may vary during the life time of the capacitor 72. Specifically, the inventor discovered that magnitude of the voltage $V_{DC}$ increases as capacitance of the capacitor 721 decreases, and phase of the voltage $V_{DC}$ shifts as ESR of the capacitor 721 increases. Moreover, the inventor discovered that the magnitude of the voltage $V_{DC}$ is independently affected by decreasing of the capacitance of the capacitor 721, and the phase shift of the voltage $V_{DC}$ is independently affected by increment of the ESR of the capacitor 722.

Figure 3:
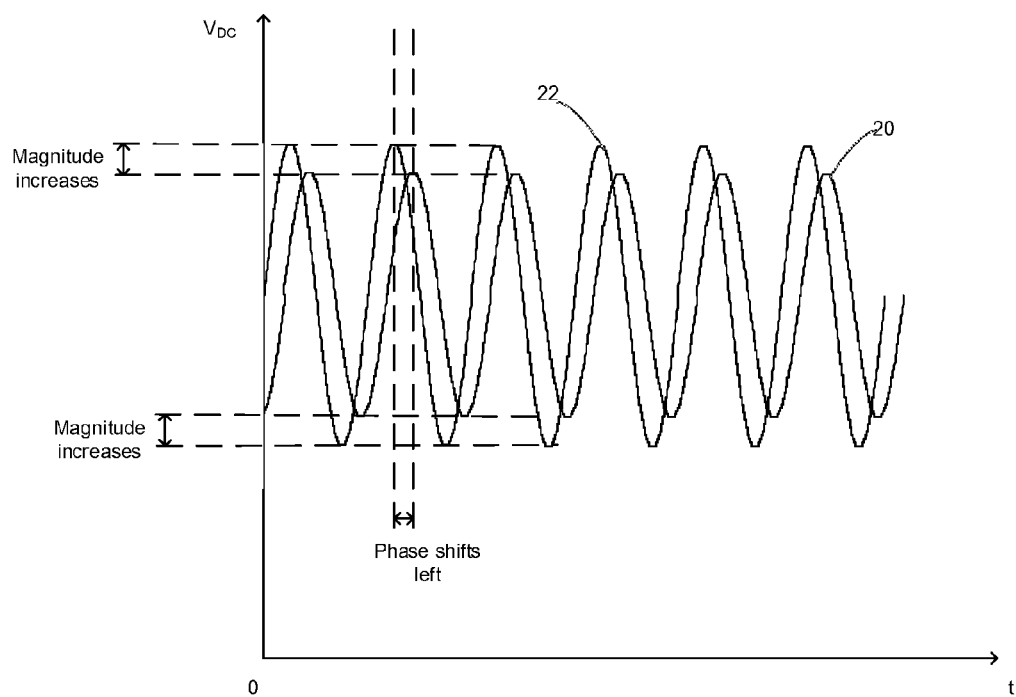
FIG. 3 illustrates a diagram showing phase shift and magnitude increment in accordance with some example embodiments of the present disclosure.

FIG. 3 illustrates a diagram showing phase shift and magnitude increment in accordance with some example embodiments of the present disclosure. The waveform 20 represents a waveform of the voltage $V_{DC}$ in case that a new capacitor 72 is used in the DC-link. The waveform 22 represents a waveform of the voltage $V_{DC}$ by the same capacitor 72 that has been served for a certain time. It can be seen that the magnitude of the waveform 22 increases with respect to the magnitude of the waveform 20, and the phase of the waveform 22 shifts left with respect to the phase of the waveform 20. The term "magnitude" may refer to highest peak value to lowest peak value of voltages herein.

To measure phase angle shift between a new capacitor and a used capacitor, a reference phase is needed. The reference phase may include phase of a rectified voltage at the output of the rectifier. Alternatively, the reference phase may include phase of a supply voltage at the input of the rectifier, since the phase of the supply voltage is generally synchronized to the phase of the rectified voltage.

Figure 4:
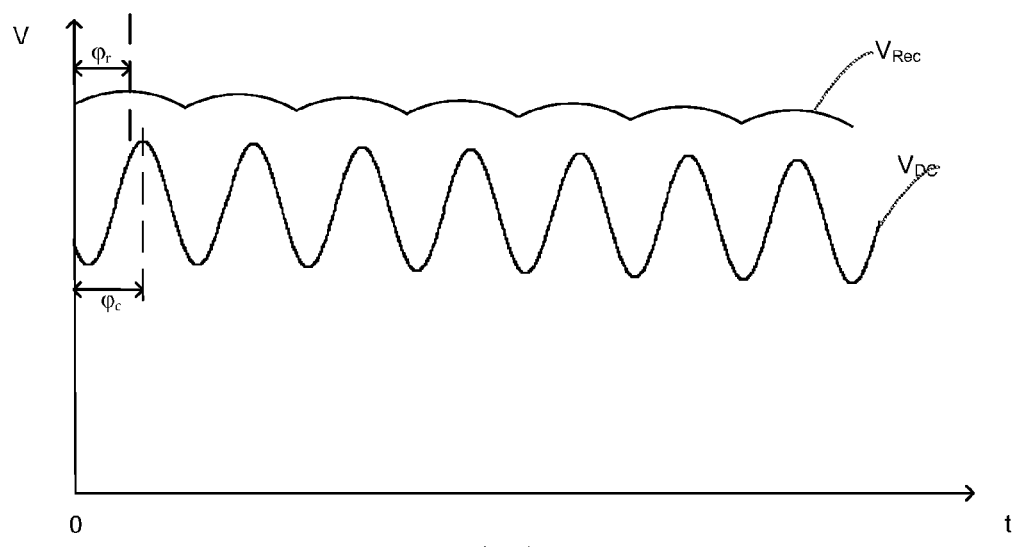
FIG. 4 illustrates a diagram showing phase shift of a rectified voltage and phase shift of a voltage of a DC-link in accordance with some example embodiments of the present disclosure.

FIG. 4 illustrates a diagram showing phase shift of a rectified voltage and phase shift of a voltage of a DC-link in accordance with some example embodiments of the present disclosure. The peak of the waveform of the voltage $V_{Rec}$ at the output of the rectifier may occur before the peak of the waveform of the voltage $V_{DC}$ of the DC-link. Thus, the two waveforms may have a phase angle difference $\Delta\varphi$ in equation (1).

$$\Delta\varphi = \varphi_c - \varphi_r \qquad (1)$$

where $\Delta\varphi$ represents phase angle difference between the waveform of the voltage $V_{DC}$ and the waveform of the voltage $V_{Rec}$, $\varphi_c$ represents the phase of the voltage $V_{DC}$, and $\varphi_r$ represents the phase of the voltage $V_{Rec}$.

Thus, the phase angle difference $\Delta\varphi$ for a new capacitor may be referred as $\Delta\varphi_n$, and the phase angle difference $\Delta\varphi$ for a used capacitor may be referred as $\Delta\varphi_u$.

The phase angle shift $\Delta\varphi_s$ thus may be expressed in the equation (2).

$$\Delta\varphi_s = \Delta\varphi_u - \Delta\varphi_n \qquad (2)$$

where $\Delta\varphi_s$ represents phase angle shift between the phase angle difference for a used capacitor and the phase angle difference for a new capacitor, $\Delta\varphi_u$ represents the phase angle difference for the used capacitor, and $\Delta\varphi_n$ represents the phase angle difference for the new capacitor.

Figure 5:
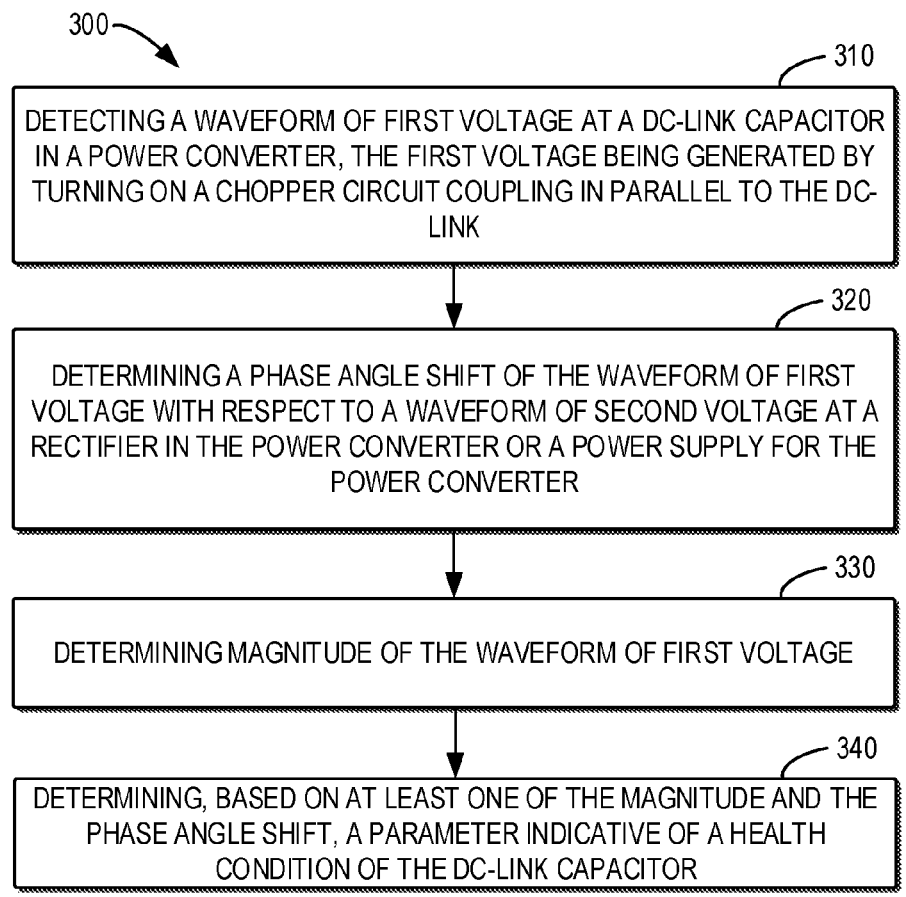
FIG. 5 illustrates a flowchart of a process of circuit monitoring in accordance with some example embodiments of the present disclosure.

FIG. 5 illustrates a flowchart of a process 300 in accordance with some example embodiments of the present disclosure. The process 300 can be implemented to carry out monitoring of a DC-link capacitor 72 in a power converter, without suspending the operations of the power converter. In some embodiments, the process 300 can be implemented by a device having processing capability. Herein the DC-link capacitor 72 to be monitored may include any type of one or more capacitors in the power converter. One example of the DC-link capacitor is an electrolytic capacitor (E-Cap). The power converter may also be any type of power converters, such as a DC-DC converter, a DC-alternate current (AC) converter, an AC-DC converter, and the like.

At 310, a waveform of first voltage $V_{DC}$ at a DC-link capacitor in a power converter is detected. The first voltage $V_{DC}$ is generated by turning on a chopper circuit 6 coupling in parallel to the DC-link 7. The waveform of first voltage $V_{DC}$ may be the waveform of voltage $V_{DC}$ shown in FIG. 4. The chopper circuit 6 may be the chopper circuit 6 in FIG. 1. The chopper circuit 6 may include a serial connection of a resistor 62 and a switch transistor 61, such as insulated gate bipolar transistor (IGBT).

The chopper circuit 6 is operable to produce a ripple on the first voltage $V_{DC}$ in response to turn on the switch transistor 61. The chopper circuit 6 is widely incorporated in conventional power conversion systems. Thus, the chopper circuit 6 herein produces ripple without introducing additional components. Alternatively, an additional chopper circuit may be provided in an apparatus for circuit sensing. The apparatus may also include a detector for detecting the waveform of first voltage at the DC-link, and a controller to implement the process 300.

At 320, a phase angle shift of the waveform of first voltage $V_{DC}$ with respect to a waveform of second voltage at a rectifier in the power converter or a power supply for the power converter is detected. The phase angle shift may be detected in two manners. The first one is to detect the waveform of the first voltage $V_{DC}$ and the second voltage simultaneously, such that the phase difference between the first voltage and the second voltage can be determined as the phase angle shift. The second one is to detect the waveform of the first voltage $V_{DC}$ once the second voltage arrives at a certain phase. The phase difference between the first voltage $V_{DC}$ and the second voltage can be determined based on known phase of second voltage and the detected phase of first voltage $V_{DC}$.

As shown in FIG. 3, the phase of the waveform of first voltage $V_{DC}$ may shift to the left as serving time of the capacitor increases. Thus, the phase angle shift of the waveform of first voltage $V_{DC}$ with respect to a waveform of second voltage at a rectifier in the power converter or a power supply for the power converter may vary, as serving time of the capacitor increases. The variation is proportional to the ESR of the capacitor. In this case, a predetermined relationship may be determined and stored in a lookup table in a storage device. Once a phase angle shift of the waveform of first voltage $V_{DC}$ with respect to a waveform of second voltage is detected, the ESR of the capacitor 72 can be thus determined by looking up in the table. This is merely for illustration without suggesting any limitations as to the scope of the subject matter described here. Other suitable method for determining the ESR based on the phase angle shift may be possible.

At 330, the magnitude of the waveform of the first voltage $V_{DC}$ is determined. As shown in FIG. 3, the magnitude of the waveform of the first voltage $V_{DC}$ may increase as serving time of the capacitor increases. The magnitude increased as the capacitance of the capacitor 72 decreases. In this case, a predetermined relationship between the magnitude of the first voltage $V_{DC}$ and the capacitance of the capacitor 72 may be determined and stored in a lookup table in a storage device. Once a magnitude of the first voltage $V_{DC}$ is detected, the capacitance of the capacitor 72 can be thus determined by looking up in the table. This is merely for illustration without suggesting any limitations as to the scope of the subject matter described here. Other suitable method for determining the capacitance based on the magnitude may be possible.

At 340, a parameter indicative of a health condition of the DC-link capacitor 72 is determined based on at least one of the magnitude and the phase angle shift. As described above, the magnitude increases as the capacitance decreases, and the phase angle shift varies in a direction as the ESR increases. The health condition of the DC-link capacitor 72 including the capacitance and the ESR may be determined based on at least one of the magnitude and the phase angle shift. In an example, a parameter indicative of the health condition of the DC-link capacitor 72 may include at least one of the capacitance, the ESR, a remaining service time, a score based on the ESR and the capacitance, and the combination thereof.

By monitoring both capacitance and ESR of the capacitor 72, the health condition of the capacitor 72 may be more effectively monitored. Also, since the power conversion system 1 may replace a new capacitor with a used capacitor, and the new capacitor and the used capacitor may come from different providers, the embodiments herein may store various predetermined relationships and thresholds for various capacitors to provide a more precise monitoring result. In addition, by reutilizing the existing components in the conventional power conversion system, such as the voltage detector 8 and the chopper circuit 6, the embodiments herein can on-line monitor health condition of the capacitor 72 without large cost.

Figure 6:
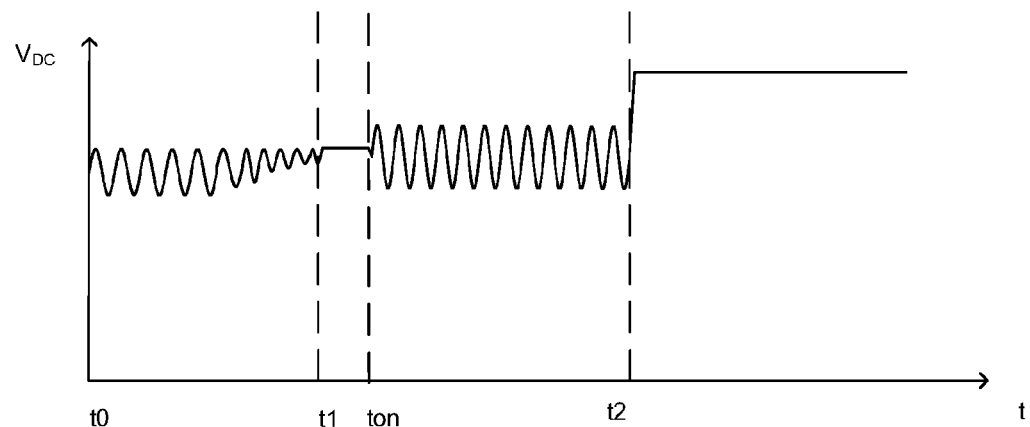
FIG. 6 illustrates a diagram showing waveform of the voltage of the DC-link in accordance with some example embodiments of the present disclosure.

FIG. 6 illustrates a diagram showing waveform of the voltage of the DC-link in accordance with some example embodiments of the present disclosure. The power conversion system 1 may start at time to, and the capacitor 72 in the DC-link 7 is charged with switch 73 being turned off. At this stage, the first voltage $V_{DC}$ resonates and have ripple. The first voltage $V_{DC}$ becomes stable at time t1. The chopper circuit 6 may turn on at a time ton after the time t1 so as to cause ripple on the first voltage $V_{DC}$. The chopper circuit 6 may turn off at the time t2 to end the process 300 of circuit monitoring, and the once again first voltage $V_{DC}$ becomes stable.

In an example, the process 300 of circuit monitoring may be implemented in a test mode of the power conversion system 1. The test mode refers to a mode that no load of the power converter is present and the voltage at the DC-link capacitor 72 is stable. For example, the test mode may be from the time t1 to the time t2. This is merely for illustration without suggesting any limitations as to the scope of the subject matter described here. In another example, the process 300 of circuit monitory may be implemented in a case of a light load or a heavy load by ruling out influence of the light or heavy load on the first voltage $V_{DC}$.

Figure 7:
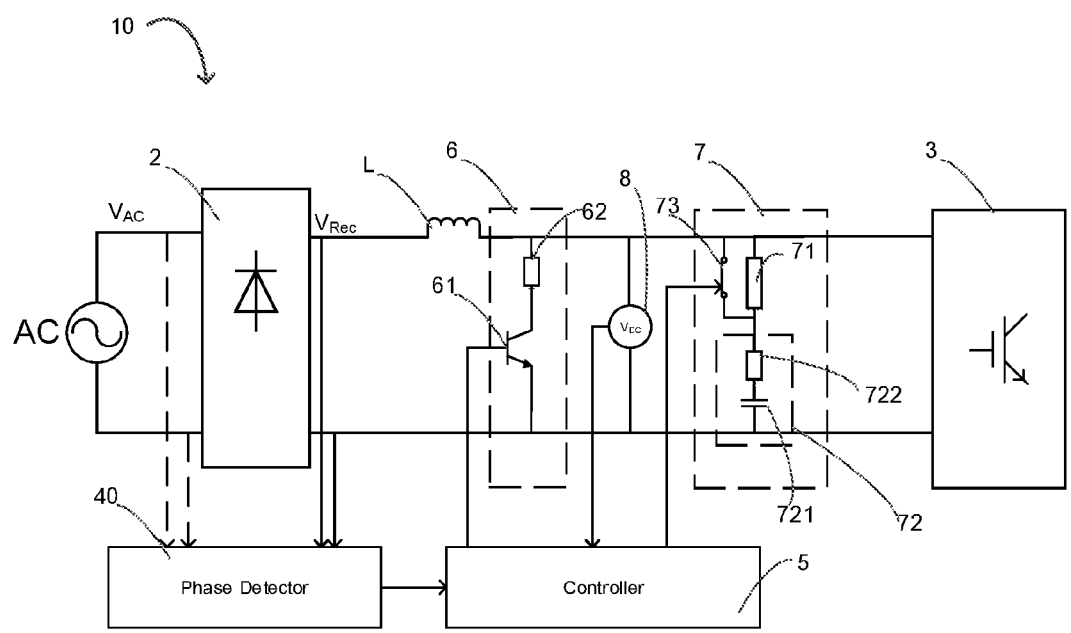
FIG. 7 illustrates a schematic diagram of a power conversion system with an apparatus of circuit monitoring in accordance with some example embodiments of the present disclosure.

FIG. 7 illustrates a schematic diagram of a power conversion system 10 with an apparatus of circuit monitoring in accordance with some example embodiments of the present disclosure. The power conversion system 10 is similar to the power conversion system 1 of FIG. 1, except for the phase detector 40 in the apparatus. The phase detector 40 is configured to detect a particular phase of the second voltage selected from the voltage $V_{AC}$ at the power supply AC or the voltage $V_{Rec}$ rectified by the rectifier 2.

Once the controller 5 receives a signal indicative of the particular phase has arrived, the controller 5 turns on the switch transistor 61 to cause ripple on the first voltage $V_{DC}$, and detects a phase of the waveform of the first voltage $V_{DC}$ for determining the phase angle shift based on the particular phase and the detected phase of the waveform of the first voltage $V_{DC}$. By replacing the voltage sensor with a phase detector, the apparatus for circuit monitoring may be less complex, and computing for phase shift angle may be simpler.

Figure 8A:
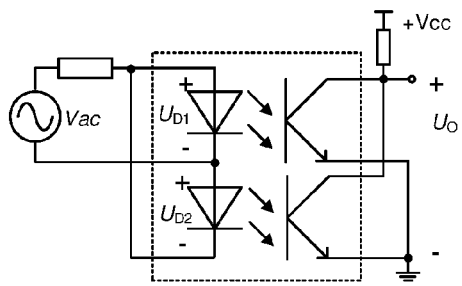
FIGS. 8A-8B illustrate a phase detector and its voltage waveform in accordance with a first example of embodiments of the present disclosure.
Figure 8B:
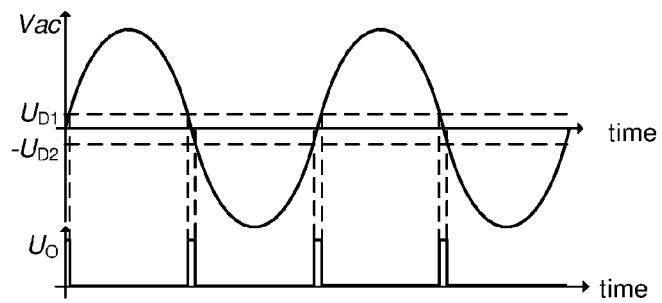

FIGS. 8A-8B illustrate a phase detector and its voltage waveform in accordance with a first example of embodiments of the present disclosure. The phase detector may include a configuration of optocoupler, as shown in FIG. 8A. The waveforms of input and output of optocoupler are shown in FIG. 8B. Either the diode UD1 or the diode UD2 is forward bias, the output Uo of the optocoupler is low. Only when the diodes are from forward bias to reverse bias or from reverse bias to forward bias, a very short high transient may occur at the output Uo of the optocoupler.

The controller 5 thus receives a sequence of pulses indicating that a particular phase of the second voltage has been arrived. The controller 5 may turns on the switch transistor 61 to cause ripple on the first voltage $V_{DC}$, and detects a phase of the waveform of the first voltage $V_{DC}$ for determining the phase angle shift based on the particular phase and the detected phase of the waveform of the first voltage $V_{DC}$.

Figure 9A:
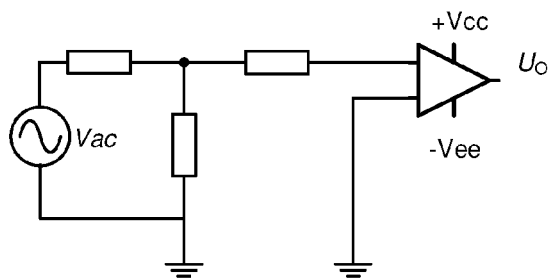
FIGS. 9A-9B illustrate a phase detector and its voltage waveform in accordance with a second example of embodiments of the present disclosure.
Figure 9B:
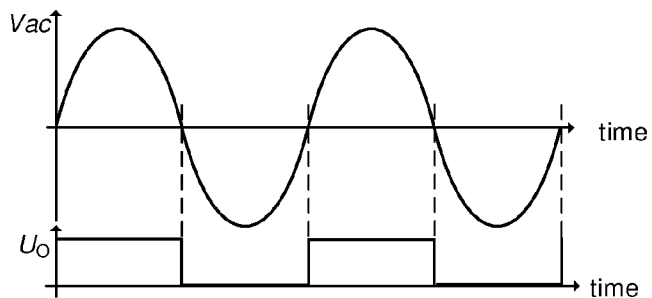

FIGS. 9A-9B illustrate a phase detector and its voltage waveform in accordance with a second example of embodiments of the present disclosure. The phase detector may include an operational amplifier. The operational amplifier is configured to compare a voltage proportional to the Vac with the ground, and output pulses indicating a particular phase at an edge. The controller 5 receives the pulses, and turns on the switch transistor 61 to cause ripple on the first voltage $V_{DC}$ based on the edges of the pulses. The controller 5 then detects a phase of the waveform of the first voltage $V_{DC}$ for determining the phase angle shift based on the particular phase and the detected phase of the waveform of the first voltage $V_{DC}$.

Figure 10:
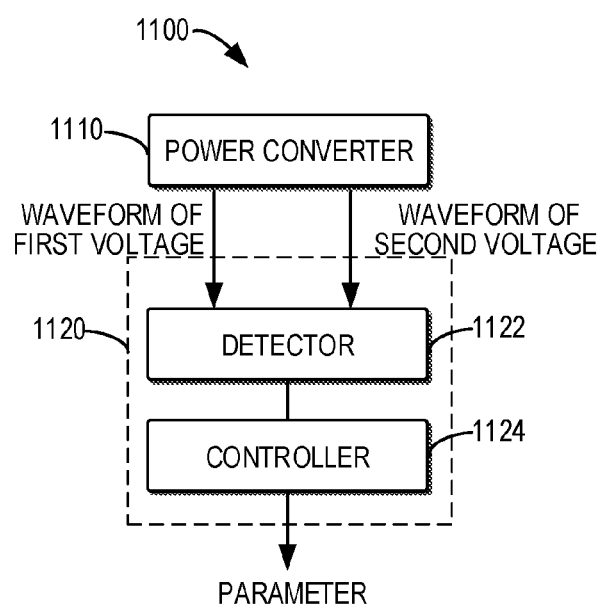
FIG. 10 illustrates a block diagram of an example system in which embodiments of the present disclosure can be applied.

FIG. 10 illustrates a block diagram of an example system in which embodiments of the present disclosure can be applied. In some embodiments, the system 1100 may be deployed as an Internet-of-Things (IoT) system. In the system 1100, a power converter 1110 is connected wiredly or wirelessly to a system 1120 for on-line monitoring of a DC-link capacitor included in the power converter 1110. Although one power converter is shown, in some embodiments, more than one power converter may be included and connected to the system 1120 to monitor the condition of the DC-link capacitors included therein. In other examples, more than one system 1120 may be included to monitor the respective power converters in the system 1100.

As shown, the system 1120 includes a detector 1122 configured to detect, from the power converter 1110, a first waveform of voltage at the DC-link capacitor that is generated by turning on a chopper circuit. The system 1120 also includes a controller 1124 configured to determine a phase angle shift of the waveform of first voltage with respect to a waveform of second voltage at a rectifier in the power converter or a power supply for the power converter. The controller 1124 may be further configured to determine magnitude of the waveform of first voltage, and determine based on at least one of the magnitude and the phase angle shift, a parameter indicative of a health condition of the DC-link capacitor.

In some embodiments, the controller 1124 may be configured to determine capacitance of the DC-link capacitor based on the magnitude, and determine equivalent series resistance (ESR) of the DC-link capacitor based on the phase angle shift.

In some embodiments, the controller 1124 may be configured to determine based on the magnitude, the capacitance with a lookup table storing relationship between capacitances and magnitudes, and determine the ESR comprises determining, based on the phase angle shift, the ESR with a lookup table storing relationship between ESRs and phase angle shifts.

In some embodiments, the controller 1124 may be configured to compare the determined parameter with a threshold, and generate an alert signal in response to the determined parameter exceeding the threshold.

In some embodiments, the controller 1124 may be configured to determine a first ratio of the capacitance to an initial capacitance of the DC-link capacitor, determine a second ratio of the ESR to an initial ESR of the DC-link capacitor, and determine residue time based on at least one of the first ratio and second ratio.

In some embodiments, the controller 1124 may be configured to detect a first phase angle of the waveform of first voltage and a second phase angle of the waveform of second voltage simultaneously, and determine difference between the first phase angle and the second angle as the phase angle shift.

In some embodiments, the controller 1124 may be configured to detect a phase angle of the waveform of second voltage, and detect the waveform of first voltage in response to the detected phase angle arriving at or exceeding a predetermined angle.

In some embodiments, the controller 1124 may be configured to detect a phase angle of the waveform of second voltage, and detect the waveform of first voltage in response to the detected phase angle arriving at a predetermined angle.

In some embodiments, the controller 1124 may be configured to detect a first phase angle of the waveform of first voltage, and determine a difference between the first phase angle and the predetermined angle as the phase angle shift.

In some embodiments, operation of the controller 1124 is performed in case that no load of the power converter is present and the voltage at the DC-link capacitor is stable.

In some embodiments, the waveform of first voltage is filtered with a high pass filter, and the controller 1124 may be configured to determine, based on the filtered waveform of first voltage, the phase angle shift and the magnitude.

It should be appreciated that blocks included in the system 1120 correspond to the blocks of the process 300. Therefore, all operations and features described above with reference to FIGS. 1 to 9 are likewise applicable to the units included in the system 1120 and have similar effects.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

The present disclosure also provides at least one computer program product tangibly stored on a non-transitory computer readable storage medium. The computer program product includes computer-executable instructions, such as those included in program modules, being executed in a device on a target real or virtual processor, to carry out the process or method as described above with reference to FIG. 3. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. On the other hand, various features that are described in the context of a single embodiment may also be implemented in multiple embodiments separately or in any suitable subcombination.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for circuit monitoring, comprising:
  detecting a waveform of first voltage at a DC-link capacitor in a power converter, the first voltage being generated by turning on a chopper circuit coupling in parallel to the DC-link;
  determining a phase angle shift of the waveform of first voltage with respect to a waveform of second voltage at a rectifier in the power converter or a power supply for the power converter;
  determining magnitude of the waveform of first voltage; and
  determining, based on at least one of the magnitude and the phase angle shift, a parameter indicative of a health condition of the DC-link capacitor.

2. The method of claim 1, wherein determining the parameter comprises at least one of the following:
  determining capacitance of the DC-link capacitor based on the magnitude; and
  determining equivalent series resistance (ESR) of the DC-link capacitor based on the phase angle shift.

3. The method of claim 2, wherein:
  determining the capacitance comprises determining, based on the magnitude, the capacitance with a lookup table storing relationship between capacitances and magnitudes; and
  determining the ESR comprises determining, based on the phase angle shift, the ESR with a lookup table storing relationship between ESRs and phase angle shifts.

4. The method of claim 1, further comprising:
  comparing the determined parameter with a threshold; and
  generating an alert signal in response to the determined parameter exceeding the threshold.

5. The method of claim 2, further comprising:
  determining a first ratio of the capacitance to an initial capacitance of the DC-link capacitor;
  determining a second ratio of the ESR to an initial ESR of the DC-link capacitor; and
  determining residue time based on at least one of the first ratio and second ratio.

6. The method of claim 1, wherein determining the phase angle shift comprises:
  detecting a first phase angle of the waveform of first voltage and a second phase angle of the waveform of second voltage simultaneously; and
  determining difference between the first phase angle and the second angle as the phase angle shift.

7. The method of claim 1, further comprising:
  detecting a phase angle of the waveform of second voltage; and
  detecting the waveform of first voltage in response to the detected phase angle arriving at a predetermined angle.

8. The method of claim 7, wherein determining the phase angle shift comprises:
  detecting a first phase angle of the waveform of first voltage; and
  determining a difference between the first phase angle and the predetermined angle as the phase angle shift.

9. The method of claim 1, wherein the method is performed in case that no load of the power converter is present and the voltage at the DC-link capacitor is stable.

10. The method of claim 1, further comprises:
  filtering the waveform of first voltage with a high pass filter; and
  determining, based on the filtered waveform of first voltage, the phase angle shift and the magnitude.

11. A non-transitory computer readable medium having instructions stored thereon, the instructions, when executed on at least one processor, cause the at least one processor to perform circuit monitoring operation, comprising:
  detecting a waveform of first voltage at a DC-link capacitor in a power converter, the first voltage being generated by turning on a chopper circuit coupling in parallel to the DC-link;

determining a phase angle shift of the waveform of first voltage with respect to a waveform of second voltage at a rectifier in the power converter or a power supply for the power converter;

determining magnitude of the waveform of first voltage; and determining, based on at least one of the magnitude and the phase angle shift, a parameter indicative of a health condition of the DC-link capacitor.

12. A computer program product being tangibly stored on a non-transitory computer readable storage medium and comprising instructions which, when executed on at least one processor, cause the at least one processor to perform circuit monitoring operation, comprising:

detecting a waveform of first voltage at a DC-link capacitor in a power converter, the first voltage being generated by turning on a chopper circuit coupling in parallel to the DC-link;

determining a phase angle shift of the waveform of first voltage with respect to a waveform of second voltage at a rectifier in the power converter or a power supply for the power converter;

determining magnitude of the waveform of first voltage; and determining, based on at least one of the magnitude and the phase angle shift, a parameter indicative of a health condition of the DC-link capacitor.

13. An apparatus for circuit monitoring, comprising:

a voltage detector configured to detect a waveform of first voltage at a DC-link capacitor in a power converter, the first voltage being generated by turning on a chopper circuit coupling in parallel to the DC-link;

a voltage sensor configured to detect a waveform of second voltage at a rectifier; and a controller configured to:

determine a phase angle shift of the waveform of first voltage with respect to the waveform of second voltage at the rectifier in the power converter or a power supply for the power converter;

determine magnitude of the waveform of first voltage; and determine, based on at least one of the magnitude and the phase angle shift, a parameter indicative of a health condition of the DC-link capacitor.

14. The apparatus of claim 13, wherein the controller is further configured to determine at least one of the following:

capacitance of the DC-link capacitor based on the magnitude; and equivalent series resistance (ESR) of the DC-link capacitor based on the phase angle shift.

15. The apparatus of claim 14, wherein the controller is further configured to:

determine, based on the magnitude, the capacitance with a lookup table storing relationship between capacitances and magnitudes; and determine, based on the phase angle shift, the ESR with a lookup table storing relationship between ESRs and phase angle shifts.

16. The apparatus of claim 13, wherein the controller is further configured to:

compare the determined parameter with a threshold; and generate an alert signal in response to the determined parameter exceeding the threshold.

17. The apparatus of claim 13, wherein the controller is further configured to:

detect a first phase angle of the waveform of first voltage and a second phase angle of the waveform of second voltage simultaneously; and determine a difference between the first phase angle and the second angle as the phase angle shift.

18. The apparatus of claim 13, wherein the controller is configured to operate in case that no load of the power converter is present and the voltage at the DC-link capacitor is stable.

19. A power conversion system, comprising:

a power converter; and an apparatus of claim 13, configured to monitor a direct current (DC)-link capacitor in the power converter.

* * * * *